(12) United States Patent
Stewart et al.

(10) Patent No.: US 10,389,313 B2
(45) Date of Patent: *Aug. 20, 2019

(54) DISTRIBUTED ANTENNA SYSTEM ARCHITECTURES

(71) Applicant: CommScope Technologies LLC, Hickory, NC (US)

(72) Inventors: Kenneth Anderson Stewart, Sunnyvale, CA (US); Larry G. Fischer, Waseca, MN (US)

(73) Assignee: CommScope Technologies LLC, Hickory, NC (US)

( * ) Notice: Subject to any disclaimer, the term of this patent is extended or adjusted under 35 U.S.C. 154(b) by 163 days.

This patent is subject to a terminal disclaimer.

(21) Appl. No.: 15/688,400

(22) Filed: Aug. 28, 2017

(65) Prior Publication Data
US 2017/0373648 A1    Dec. 28, 2017

Related U.S. Application Data

(63) Continuation of application No. 13/495,220, filed on Jun. 13, 2012, now Pat. No. 9,748,906.
(Continued)

(51) Int. Cl.
*H03F 1/32* (2006.01)
*H04B 1/525* (2015.01)
(Continued)

(52) U.S. Cl.
CPC ........... *H03F 1/3247* (2013.01); *H04B 1/525* (2013.01); *H04L 5/1423* (2013.01); *H04L 25/03343* (2013.01)

(58) Field of Classification Search
CPC .................................................. H03F 1/3247
See application file for complete search history.

(56) References Cited

U.S. PATENT DOCUMENTS 7,239,217 B2 *  7/2007  Satoh ................. H03H 7/465
                                                   333/133
7,809,047 B2    10/2010  Kummetz
(Continued)

FOREIGN PATENT DOCUMENTS

CN         1829138 A        9/2006
WO      2010057384 A1       5/2010

OTHER PUBLICATIONS

European Patent Office, "Communication pursuant to Article 94(3) EPC from EP Application No. 12800117.9 dated Jan. 3, 2019", from Foreign Counterpart to U.S. Appl. No. 13/495,220, filed Jan. 3, 2019, pp. 1-5, Published: EP.
(Continued)

*Primary Examiner* — Ankur Jain
(74) *Attorney, Agent, or Firm* — Fogg & Powers LLC (57) ABSTRACT

One embodiment is directed to a distributed antenna system comprising a host unit and at least one remote antenna unit that is communicatively coupled to the host unit. The host unit is configured to communicate a downstream transport signal from the host unit to the remote antenna unit. The remote antenna unit to which the downstream transport signal is communicated uses the downstream transport signal to generate a downstream radio frequency signal for radiation from an antenna associated with the remote antenna unit. The remote antenna unit is configured to communicate an upstream transport signal from the remote antenna unit to the host unit, wherein the upstream transport signal is generated from a received upstream radio frequency signal received at the remote antenna unit. The remote antenna unit is configured to perform self-interference suppression processing in an upstream signal path using, as an input thereto, a feedback signal derived from the
(Continued)

downstream radio frequency signal radiated from the antenna. Other embodiments are disclosed.

20 Claims, 6 Drawing Sheets

Related U.S. Application Data (60) Provisional application No. 61/496,548, filed on Jun. 13, 2011.

(51) Int. Cl.
  *H04L 5/14* (2006.01)
  *H04L 25/03* (2006.01)

(56) References Cited

U.S. PATENT DOCUMENTS

| | | | |
|---|---|---|---|
| 9,748,906 B2 | 8/2017 | Stewart et al. | |
| 2009/0207896 A1 | 8/2009 | Behzad | |
| 2009/0232510 A1* | 9/2009 | Gupta | H04L 27/2096 398/136 |
| 2009/0238573 A1 | 9/2009 | Bauman | |
| 2010/0166109 A1 | 7/2010 | Neumann et al. | |
| 2010/0197231 A1* | 8/2010 | Kenington | H04B 1/525 455/63.1 |
| 2011/0158081 A1* | 6/2011 | Wang | H03F 1/304 370/201 |
| 2011/0228828 A1* | 9/2011 | Wang | H04B 1/126 375/219 |
| 2013/0077556 A1 | 3/2013 | Gore et al. | |
| 2014/0119411 A1 | 5/2014 | Kummetz | |

OTHER PUBLICATIONS

European Patent Office, "Extended European Search Report from EP Application No. 12800117.9 dated Feb. 27, 2015", from Foreign Counterpart to U.S. Appl. No. 13/495,220, filed Feb. 27, 2015, pp. 1-6, Published: EP.
International Bureau, "International Preliminary Report on Patentability from PCT Application No. PCT/US2012/042148 dated Jan. 3, 2014", from Foreign Counterpart to U.S. Appl. No. 13/495,220, filed Jan. 3, 2014, pp. 1-9, Published: WO.
International Searching Authority, "International Search Report and Written Opinion from PCT Application No. PCT/US2012/042148 dated Jan. 31, 2013", from Foreign Counterpart to U.S. Appl. No. 13/495,220, filed Jan. 31, 2013, pp. 1-12, Published: WO.
State Intellectual Property Office, P.R. China, "Notice to Grant from CN Application No. 201280039576.8 dated Nov. 17, 2017", from Foreign Counterpart to U.S. Appl. No. 13/495,220, filed Nov. 17, 2017, pp. 1-4, Published: CN.
State Intellectual Property Office, P.R. China, "Office Action from CN Application No. 201280039576.8 dated Mar. 4, 2016", from Foreign Counterpart to U.S. Appl. No. 13/495,220, filed Mar. 4, 2016, pp. 1-27, Published: CN.
State Intellectual Property Office, P.R. China, "Office Action from CN Application No. 201280039576.8 dated May 3, 2017", from Foreign Counterpart to PCT Application No. PCT/US2012/042148, May 3, 2017, pp. 1-7, Published: CN.
State Intellectual Property Office, P.R. China, "Office Action from CN Application No. 201280039576.8 dated Nov. 3, 2016", from Foreign Counterpart to U.S. Appl. No. 13/495,220, filed Nov. 3, 2016, pp. 1-22, Published: CN.
U.S. Patent and Trademark Office, "Examiner-Initiated Interview Summary", U.S. Appl. No. 13/495,220, filed Apr. 1, 2016, pp. 1-2, Published: US.
U.S. Patent and Trademark Office, "Advisory Action", U.S. Appl. No. 13/495,220, filed Mar. 16, 2016, pp. 1-3, Published: US.
U.S. Patent and Trademark Office, "Advisory Action", U.S. Appl. No. 13/495,220, dated Dec. 21, 2015, pp. 1-12, Published: US.
U.S. Patent and Trademark Office, "Final Office Action", U.S. Appl. No. 13/495,220, dated Oct. 5, 2015, pp. 1-16, Published: US.
U.S. Patent and Trademark Office, "Notice of Allowance", U.S. Appl. No. 13/495,220, dated Apr. 26, 2017, pp. 1-17, Published: US.
U.S. Patent and Trademark Office, "Notice of Pre-Appeal Decision", U.S. Appl. No. 13/495,220, dated Jan. 20, 2016, pp. 1-2, Published: US.
U.S. Patent and Trademark Office, "Office Action", U.S. Appl. No. 13/495,220, dated May 7, 2015, pp. 1-25, Published: US.
U.S. Patent and Trademark Office, "Office Action", U.S. Appl. No. 13/495,220, dated Sep. 8, 2016, pp. 1-20, Published: US.

* cited by examiner

DISTRIBUTED ANTENNA SYSTEM ARCHITECTURES

CROSS-REFERENCE TO RELATED APPLICATIONS

This application is a continuation application of U.S. patent application Ser. No. 13/495,220 filed Jun. 13, 2012 and entitled "DISTRIBUTED ANTENNA SYSTEM ARCHITECTURES" (currently pending), which claims priority to U.S. Provisional Patent Application Ser. No. 61/496,548, filed on Jun. 13, 2011, which are both hereby incorporated herein by reference.

BACKGROUND

This disclosure relates to distributed antenna systems, repeaters, distributed base station systems, and the like.

SUMMARY

One embodiment is directed to a distributed antenna system comprising a host unit and at least one remote antenna unit that is communicatively coupled to the host unit. The host unit is configured to communicate a downstream transport signal from the host unit to the remote antenna unit. The remote antenna unit to which the downstream transport signal is communicated uses the downstream transport signal to generate a downstream radio frequency signal for radiation from an antenna associated with the remote antenna unit. The remote antenna unit is configured to communicate an upstream transport signal from the remote antenna unit to the host unit, wherein the upstream transport signal is generated from a received upstream radio frequency signal received at the remote antenna unit. The remote antenna unit is configured to perform self-interference suppression processing in an upstream signal path using, as an input thereto, a feedback signal derived from the downstream radio frequency signal radiated from the antenna.

Another embodiment is directed to a remote antenna unit for use in a distributed antenna system. The remote antenna unit comprises a transport interface to communicatively couple the remote antenna unit to a host unit included in the distributed antenna system and to receive a downstream transport signal from the host unit. The remote antenna unit further comprises a processing unit coupled to the transport interface, at least one downstream signal branch, and at least one upstream signal branch. The processing unit and downstream signal branch are configured to use the downstream transport signal to generate a downstream radio frequency signal for radiation from an antenna associated with the remote antenna unit. The transport interface is configured to communicate an upstream transport signal from the remote antenna unit to the host unit, wherein the processing unit and the upstream signal branch are configured to generate an upstream signal from a received upstream radio frequency signal received at the remote antenna unit, wherein the transport interface uses the upstream signal to generate the upstream transport signal. The processing unit is configured to perform self-interference suppression processing on the upstream signal using, as an input thereto, a feedback signal derived from the downstream radio frequency signal radiated from the antenna.

Another embodiment is directed a remote antenna unit for use in a distributed antenna system. The remote antenna unit comprising a transport interface to communicatively couple the remote antenna unit to a host unit included in the distributed antenna system and to receive a downstream transport signal from the host unit. The remote antenna unit further comprises a processing unit coupled to the transport interface, at least one downstream signal branch, and at least one upstream signal branch. The processing unit and downstream signal branch are configured to use the downstream transport signal to generate a downstream radio frequency signal for radiation from an antenna associated with the remote antenna unit. The transport interface is configured to communicate an upstream transport signal from the remote antenna unit to the host unit, wherein the processing unit and the upstream signal branch are configured to generate an upstream signal from a received upstream radio frequency signal received at the remote antenna unit, wherein the transport interface uses the upstream signal to generate the upstream transport signal. The processing unit is configured to pre-distort an input signal to the downstream signal branch for non-linearities in the downstream signal branch using a feedback signal derived from the downstream radio frequency signal radiated from the antenna.

DETAILED DESCRIPTION

Figure 1:
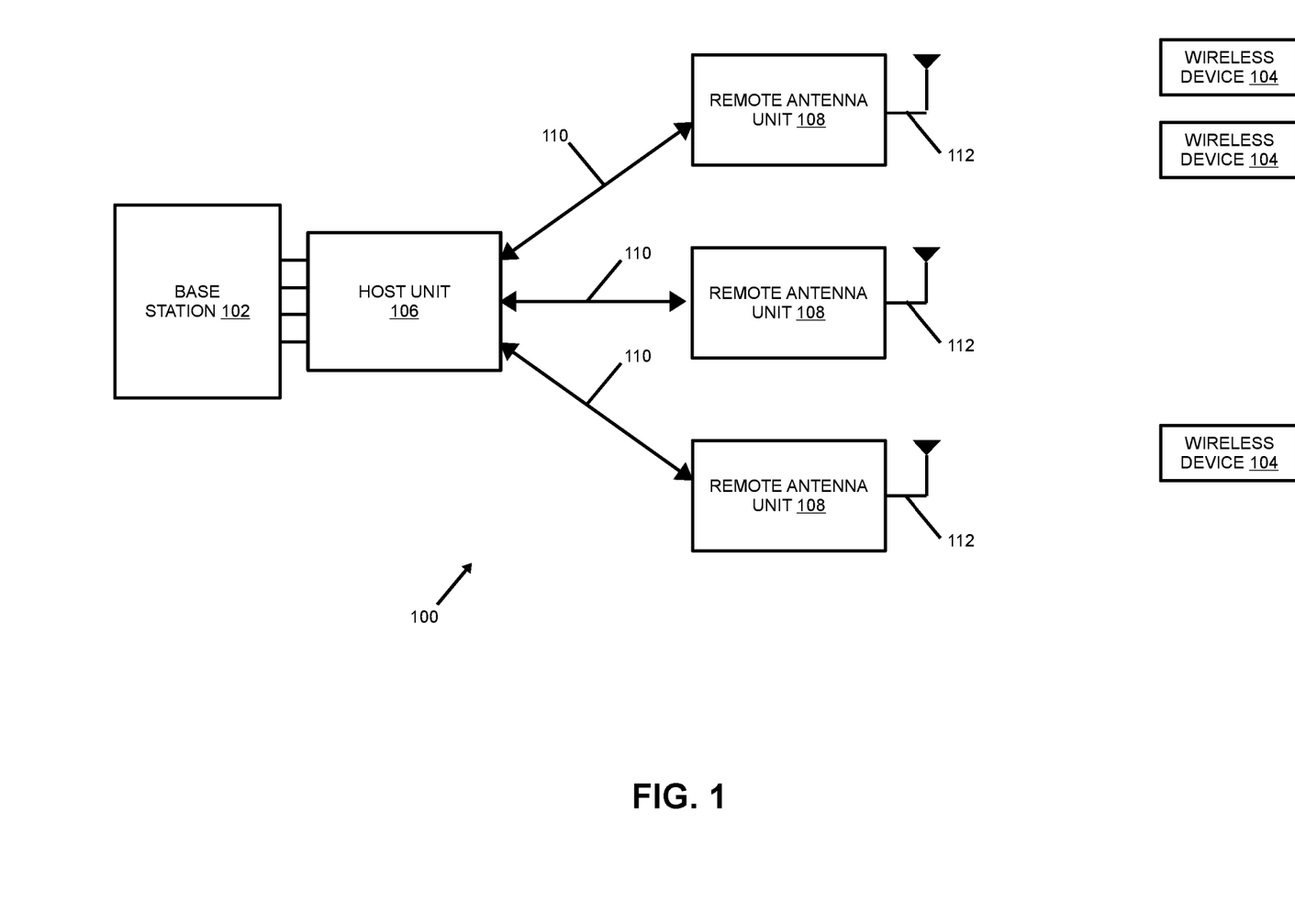
FIG. 1 is a block diagram of one exemplary embodiment of a distributed antenna system.

FIG. 1 is a block diagram of one exemplary embodiment of a distributed antenna system (DAS) 100 in which the improved remote antenna unit technology described here can be used. Although the improved remote antenna unit technology is described here in connection with the DAS 100 shown in FIG. 1, it can be used in other DAS, repeater, or distributed base station products and systems.

The DAS 100 is used to distribute bi-directional wireless communications between one or more base stations 102 and one or more wireless devices 104 (for example, mobile telephones, mobile computers, and/or combinations thereof such as personal digital assistants (PDAs) and smartphones). In the exemplary embodiment shown in FIG. 1, the DAS 100 is used to distribute a plurality of bi-directional radio frequency bands. Also, each such radio frequency band is typically used to communicate multiple logical bi-directional RF channels.

The techniques described here are especially useful in connection with the distribution of wireless communications that use licensed radio frequency spectrum, such as cellular radio frequency communications. Examples of such cellular RF communications include cellular communications that support one or more of the second generation (2G), third generation (3G), and fourth generation (4G) Global System for Mobile communication (GSM) family of telephony and data specifications and standards, one or more of the second generation (2G), third generation (3G), and fourth generation (4G) Code Division Multiple Access (CDMA) family of telephony and data specifications and standards, and/or the WIMAX family of specification and standards. In the particular exemplary embodiment described here in connection with FIG. 1, the DAS 100 is configured to handle two cellular bi-directional radio frequency bands. In other embodiments, the DAS 100, and the improved remote antenna unit technology described here, are used with wireless communications that make use of unlicensed radio frequency spectrum such as wireless local area networking communications that support one or more of the IEEE 802.11 family of standards. In other embodiments, combinations of licensed and unlicensed radio frequency spectrum are distributed.

In the exemplary embodiment described here in connection with FIG. 1, the DAS 100 is configured to distribute wireless communications that use frequency division duplexing to implement the logical bi-directional RF bands. In other embodiments, the DAS 100 is configured to communicate at least some wireless communications that use other duplexing techniques (such as time division duplexing, which is used, for example, in some WIMAX implementations).

Since the DAS 100 is configured to use frequency division duplexing in this exemplary embodiment, each of the bi-directional radio frequency bands distributed by the DAS 100 includes a separate radio frequency band for each of two directions of communications. One direction of communication is from the base station 102 to a wireless device 104 and is referred to here as the "downstream" or "downlink" direction. The other direction of communication is from the wireless device 104 to the base station 102 and is referred to here as the "upstream" or "uplink" direction. Each of the distributed bi-directional radio frequency bands includes a "downstream" band in which downstream RF channels are communicated for that bi-directional radio frequency band and an "upstream" band in which upstream RF channels are communicated for that bi-directional radio frequency band. The downstream and upstream bands for a given bi-directional radio frequency band need not be, and typically are not, contiguous.

In the exemplary embodiment shown in FIG. 1, the DAS 100 includes a host unit 106 and one or more remote antenna units 108. The DAS 100 shown in FIG. 1 uses one host unit 106 and three remote antenna units 108, though it is to be understood that other numbers of host units 106 and/or remote antenna units 108 can be used.

The host unit 106 is communicatively coupled to the one or more base stations 102 either directly (for example, via one or more coaxial cable connections) or indirectly (for example, via one or more donor antennas and one or more bidirectional amplifiers).

In the exemplary embodiment shown in FIG. 1, the host unit 106 is communicatively coupled to each remote antenna units 108 over a transport communication medium or media. The transport communication media can be implemented in various ways. For example, the transport communication media can be implemented using respective separate point-to-point communication links, for example, where respective optical fiber or copper cabling is used to directly connect the host unit 106 to each remote antenna unit 108. One such example is shown in FIG. 1, where the host unit 106 is directly connected to each remote antenna unit 108 using a respective optical fiber 110. Also, in the embodiment shown in FIG. 1, a single optical fiber 110 is used to connect the host unit 106 to each remote antenna unit 108, where wave division multiplexing (WDM) is used to communicate both downstream and upstream signals over the single optical fiber 110. In other embodiments, the host unit 106 is directly connected to each remote antenna unit 108 using more than one optical fiber (for example, using two optical fibers, where one optical fiber is used for communicating downstream signals and the other optical fiber is used for communicating upstream signals). Also, in other embodiments, the host unit 106 is directly connected to one or more of the remote antenna units 108 using other types of communication media such a coaxial cabling (for example, RG6, RG11, or RG59 coaxial cabling), twisted-pair cabling (for example, CAT-5 or CAT-6 cabling), or wireless communications (for example, microwave or free-space optical communications).

Figure 6:
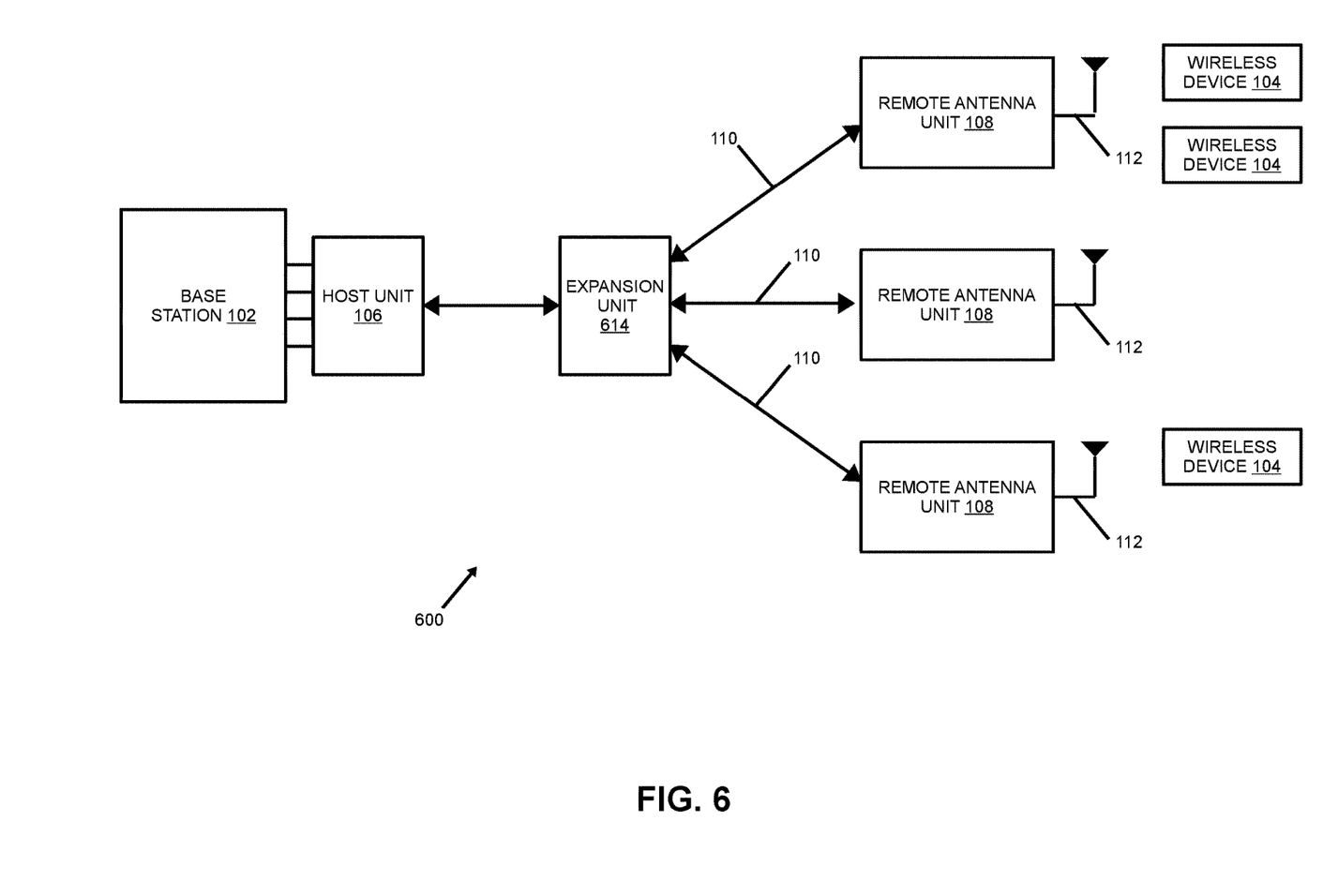
FIG. 6 is a block diagram of an exemplary embodiment of a distributed antenna system that includes an expansion unit.

The transport communication media can also be implemented using shared point-to-multipoint communication media in addition to or instead of using point-to-point communication media. One example of such an implementation is where the host unit 106 is directly coupled to an intermediary unit (also sometimes referred to as an "expansion" unit), which in turn is directly coupled to multiple remote antenna units 108. One example of such a DAS 600 is shown in FIG. 6, where the host unit 106 is directly connected to an expansion unit 614, which in turn is directly connected to the multiple remote antenna units 108. Another example of a shared transport implementation is where the host unit 106 is coupled to the remote antenna units using an Internet Protocol (IP) network.

Each remote antenna unit 108 includes or is coupled to at least one antenna 112 via which the remote antenna unit 108 receives and radiates radio frequency signals (as described in more detail below).

In general, downstream RF signals transmitted by the base station 102 (also referred to here as "downstream RF signals") are received at the host unit 106. The downstream RF signals include both of the downstream frequency bands distributed by the DAS 100. In the exemplary embodiment shown in FIG. 1, the downstream RF signals for each downstream frequency band are received on a respective downstream port of the host unit 106. The host unit 106 then generates a digital representation of the downstream RF signals for each downstream frequency band. In one implementation of such an embodiment, the host unit 106 is configured to down-convert the downstream RF signals for each downstream frequency band to a respective lower frequency band (also referred to here as an "intermediate frequency" band or "IF" band). The host unit 106 then digitizes the resulting downstream IF signals for each downstream band, which produces digital samples of the downstream IF signals (also referred to here as "downstream digital IF data"). These digital samples can be in the form of real samples or pairs of complex samples (having an in-phase (I) component and a quadrature (Q) component).

The host unit 106 then frames the downstream digital IF data for the downstream frequency bands together (along with appropriate overhead data) and communicates the frames to each of the remote antenna units 108 over the respective optical fibers 110. The downstream signal that is communicated to each remote antenna unit 108 is also referred to here as a "downstream transport signal". In this embodiment, the downstream transport signal that the host unit 106 generates for each remote antenna unit 108 is an optical signal that is produced by optically modulating a downstream optical carrier with the downstream framed data (which contains the downstream digital IF data for the downstream frequency bands).

Each remote antenna unit 108 receives the downstream transport signal that is communicated to that remote antenna unit 108 over a respective optical fiber 110. In general, each remote antenna unit 108 demodulates the optical downstream transport signal (or otherwise performs an optical-to-electrical (O/E) process) in order to recover the downstream framed data transmitted by the host unit 106. The remote antenna unit 108 then extracts the downstream digital IF data for each of the downstream frequency bands.

In the embodiment described here in connection with FIG. 1, each remote antenna unit 108, for each downstream frequency band, uses digital filtering techniques and/or digital signal processing on the downstream digital IF data for that downstream frequency band in order to apply one or more of the following: pre-distortion to compensate for any non-linearities in the downstream signal path and phase and/or amplitude changes for beam forming or antenna steering. Then, for each downstream frequency band, the resulting digital IF data is applied to a digital-to-analog converter to produce a downstream analog IF signal for that downstream frequency band. The analog IF signal for each downstream frequency band is then up-converted to the appropriate RF frequency band and band-pass filtered to remove any unwanted harmonics and any other unwanted signal components. Then, the resulting analog RF signal for each downstream frequency band is power amplified and is ready to be radiated from at least one antenna 112 associated with the remote antenna unit 108. Various antenna configurations can be used and are described below in connection with FIGS. 2-5.

In general, in the upstream direction, upstream RF signals for each upstream frequency band distributed by the DAS 100 are received on at least one antenna 112 at each remote antenna unit 108. Each remote antenna unit 108 then generates a digital representation of the upstream RF signals for each upstream frequency band. In one implementation of such an embodiment, the remote antenna unit 108 is configured to down-convert the upstream RF signals for each upstream frequency band to a respective IF band. Each remote antenna unit 108 then digitizes the resulting upstream IF signals for each downstream band, which produces digital samples of the upstream IF signals (also referred to here as "upstream digital IF data"). These digital samples can be in the form of real samples or pairs of complex samples (having an in-phase (I) component and a quadrature (Q) component).

Each remote antenna unit 108, for each upstream frequency band, uses digital filtering techniques and/or digital signal processing on the upstream digital IF data for that upstream frequency band in order to apply one or more of the following: post-distortion to compensate for any non-linearities in the upstream signal path, phase and/or amplitude changes for beam forming or antenna steering, and self-interference and distortion suppression.

Each remote antenna unit 108 then frames the resulting processed upstream digital IF data for the upstream frequency bands together (along with appropriate overhead data) and communicates the frames to host unit 106 over a respective optical fiber 110. The upstream signal that is communicated to host unit 106 is also referred to here as an "upstream transport signal". In this embodiment, the upstream transport signal that each remote antenna unit 108 generates is an upstream optical signal that is produced by optically modulating an upstream optical carrier with the upstream framed data (which contains the upstream digital IF data for the upstream frequency bands).

The host unit 106 receives the upstream transport signals that are communicated from all of the remote antenna units 108 over respective optical fibers 110.

The host unit 106 does the following for each of the remote antenna units 108 from which it receives signals. The host unit 106 demodulates the optical upstream transport signal (or otherwise performs an optical-to-electrical (O/E) process) in order to recover the upstream framed data transmitted by each remote antenna unit 108. The host unit 106 then extracts the upstream digital IF data for each of the upstream frequency bands.

For each of the upstream frequency bands, the host unit 106 digitally combines the upstream digital IF data received from all of the remote antenna units 108. This digital combining is performed by synchronizing the digital samples received from all of the remote antenna units 108 and then adding together (that is, digitally summing) the digital samples received from all of the remote antenna units 108 for each sample period. Appropriate overflow control is used to keep the resulting sum within a desired bit resolution. The resulting combined upstream digital IF data for each upstream frequency band is then applied to a respective digital-to-analog converter to produce an upstream analog IF signal for that upstream frequency band.

The resulting combined upstream analog IF signal for each upstream frequency band is then up-converted back to the original upstream RF frequency and band-pass filtered to remove any unwanted harmonics and any other unwanted signal components. The resulting upstream analog RF signal for each upstream frequency band is supplied to the base stations 102 (for example, over a respective upstream port of the host unit 106).

In this way, RF signals transmitted and received by the base station 102 are distributed by the DAS 100 and the resulting coverage area of the base station 102 can be expanded.

In some embodiments of the DAS 100, a single antenna 112 is used to both radiate (transmit) downstream RF signals and to receive upstream RF signals. Conventionally, when a single antenna is used for both transmitting downstream RF signals and receiving upstream RF signals, a duplexer is used to separate and isolate the received upstream RF signals from the transmitted downstream RF signals. When the transmitted downstream RF signals are amplified to the relatively high output power levels typically used in outdoor DAS systems (for example, 10 Watts), a high-power duplexer (such as a relatively large and costly cavity duplexer) has historically been used in order to prevent the transmitted downstream RF signals from inundating the components in the (receive) upstream signal paths with out-of-band power, which can cause distortion and interference in the signals produced in the upstream single paths. The use of high-power duplexers can add to the cost and size of the remote antenna unit 108. Also, the cost and size increase associated with conventional high-power duplexers is multiplied in applications where many antennas 112 are used (for example, in Multiple Input/Multiple Output (MIMO) or antenna array applications).

FIGS. 2-5 illustrate various strategies for dealing with duplexing in a remote antenna unit 108

Figure 2:
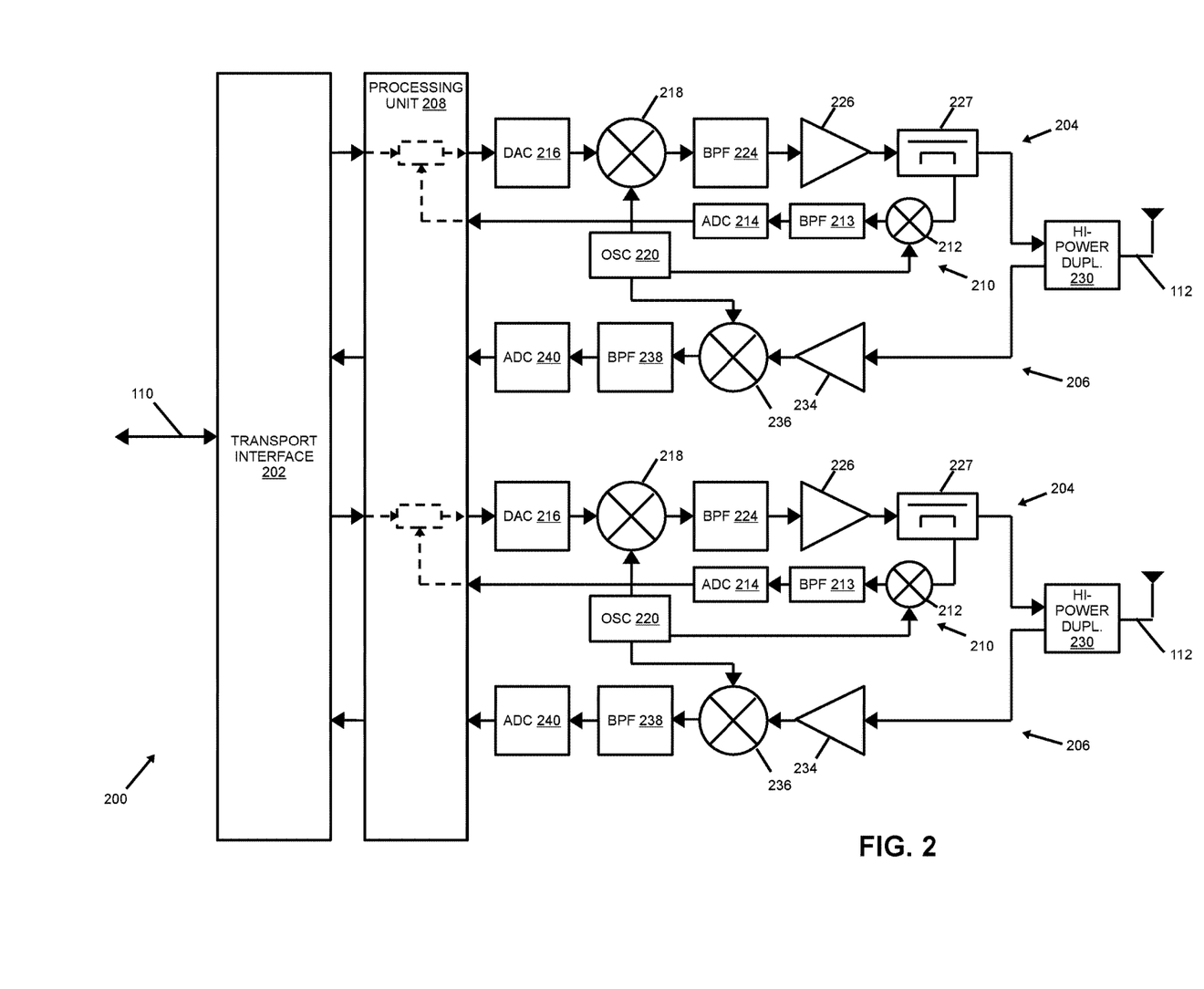
FIGS. 2-5 are block diagrams illustrating various embodiments of remote antenna units.

FIG. 2 is a block diagram of one embodiment of a remote antenna unit 200. The remote antenna unit 200 is described here as being implemented for use in the DAS 100 described above in connection with FIG. 1.

The remote antenna unit 200 includes a transport interface 202 that is coupled to the respective optical fiber 110 that is connected to that remote antenna unit 200. The transport interface 202 includes an optical demodulator that demodulates the optical downstream transport signal received on the optical fiber 110 from the host unit 106 in order to recover the downstream framed data transmitted by the host unit 106. The transport interface 202 also includes a deframer or demultiplexer to extract the downstream digital IF data for each of the downstream frequency bands from the downstream framed data.

The remote antenna unit 200 includes one or more downstream signal branches 204 and one or more upstream signal branches 206. In the exemplary embodiment shown in FIG. 2, each downstream signal branch 204 is used to process a respective one of the downstream frequency bands handled by the remote antenna unit 200. Similarly, each upstream signal branch 206 is used to process a respective one of the upstream frequency bands handled by the remote antenna unit 200.

The remote antenna unit 200 also includes a processing unit 208 that, in the exemplary embodiment shown in FIG. 2, filters the downstream digital IF data for each downstream frequency band. This filtering is done in order to pre-distort the downstream digital IF data for each downstream frequency band in order to compensate for any non-linearities in the associated downstream signal branch 204. Each downstream signal branch 204 includes a feedback path 210 by which a digitized version of the downstream RF signal that is transmitted for that downstream signal branch 204 is fed back to the processing unit 208. Each feedback path 210 includes a respective RF coupler 227 to extract a portion of the downstream RF signal transmitted for that downstream signal branch 204, a down-converter 212 to downconvert the extracted downstream RF signal, a band-pass filter 213 to remove any unwanted harmonics and any other unwanted signal components, and an analog-to-digital converter (ADC) 214 to digitize the feedback signal.

In the exemplary embodiment shown in FIG. 2, the processing unit 208 uses the data provided on each feedback path 210 to adapt the pre-distortion that is applied to the downstream digital IF data for each downstream signal branch 204 in response to changes in the downstream signal branch 204.

Each downstream signal branch 204 includes a respective digital-to-analog converter (DAC) 216. The DAC 216 in each downstream signal branch 204 is used to convert the pre-distorted digital IF data output by the processing unit 208 to a respective downstream analog IF signal for the corresponding downstream frequency band. Each downstream signal branch 204 also includes an upconverter 218 that up-converts the analog IF signal for the respective downstream frequency band to the appropriate RF frequency band. The remote antenna unit 200 includes a respective oscillator circuit 220 for each downstream signal branch 204. Each oscillator circuit 220 is configured to phase lock a local clock signal to a reference clock and to produce one or mixing signals for use by the upconverter 218 in that downstream signal branch 204 and for the downconverter 212 in the feedback path 210.

Each downstream signal branch 204 also includes a respective band-pass filter 224 that removes any unwanted harmonics and any other unwanted signal components from the downstream analog RF signal output by the upconverter 218.

Each downstream signal branch 204 also includes a respective power amplifier 226 that amplifies the downstream analog RF signal produced in that downstream signal branch 204. In the particular embodiment described here in connection with FIG. 2, the power amplifier 226 in each downstream signal branch 204 amplifies the corresponding downstream analog RF signal to a power level suitable for outdoor DAS applications (for example, 10 Watts).

In the exemplary embodiment shown in FIG. 2, the remote antenna unit 200 includes a single antenna 112 for each bi-directional RF band handled by the remote antenna unit 200. That is, both the downstream analog RF signals and the associated upstream analog RF signals for a given bi-directional RF band are transmitted and received, respectively, using the same antenna 112. Also, in the exemplary embodiment shown in FIG. 2, a respective duplexer 230 is used to couple a respective downstream signal branch 204 and a respective upstream signal branch 206 to the corresponding antenna 112. That is, the amplified downstream analog RF signals output by each downstream signal branch 204 are coupled to the respective antenna 112 via a respective duplexer 230.

As noted above, each downstream signal branch 204 includes a respective feedback path 210 by which a digitized version of the downstream analog RF signals that are output for that downstream signal branch 204 are fed back to the processing unit 208.

In the exemplary embodiment shown in FIG. 2, RF signals received on each antenna 112 are input to a respective upstream signal branch 206 via a respective duplexer 230. The duplexer 230 passes only the RF signals for the upstream frequency band associated with that upstream signal branch 206. Each upstream signal branch 206 includes a respective low noise amplifier (LNA) 234 that amplifies the received upstream analog RF signals for the associated upstream frequency band. Each upstream signal branch 206 also includes a respective downconverter 236 that down-converts the amplified analog upstream RF signals output by the LNA 234 in that upstream signal branch 206 to the appropriate upstream IF band. The oscillator circuit 220 associated with each upstream signal branch 206 outputs the mixing signal used by the downconverter 236 in that upstream signal branch 206.

Each upstream signal branch 206 also includes a respective band-pass filter 238 that removes any unwanted harmonics and any other unwanted signal components from the output of the respective downconverter 236. Each upstream signal branch 206 also includes a respective analog-to-digital converter (ADC) 240 that digitizes the respective analog upstream IF signals output for that upstream signal branch 206.

The output of each ADC 240 is input to the processing unit 208. In the exemplary embodiment shown in FIG. 2, the processing unit 208 filters the upstream digital IF data for each upstream frequency band. This filtering is done in order to post-distort the upstream digital IF data for each upstream frequency band in order to compensate for any non-linearities in the associated upstream signal branch 206.

The transport interface 202 also includes a frame or multiplexer to combine the upstream digital IF data generated for each of the upstream frequency bands together (along with appropriate overhead data). The transport interface 202 also includes an optical modulator that generates an upstream optical signal for transmitting to the host unit 106 on the optical fiber 110. The optical modulator in the optical-to-electrical interface 202 generates the upstream optical signal by optically modulating an upstream optical carrier with the upstream framed data (which contains the upstream digital IF data for the upstream frequency bands).

The architecture of the exemplary embodiment of a remote antenna unit 200 shown in FIG. 2 is conventional in nature in that it makes use of a relatively high power amplifier 226 and a high-power duplexer 230 in each of the downstream signal branches 204. The high-power duplexer 230 provides the required degree of isolation between the relatively high-power downstream RF signals transmitted from the remote antenna unit 200 and the upstream RF signals received on each such antenna 112 and prevents the transmitted downstream RF signals from inundating the components in the (receive) upstream signal paths 206 with out-of-band power. As noted above, the use of a high-power duplexer (such as a cavity duplexer) can add to the cost and size of the remote antenna unit 200. Also, the cost and size increase associated with conventional high-power duplexers is multiplied in applications where many antennas 112 are used (for example, in MIMO or antenna array applications).

Figure 3:
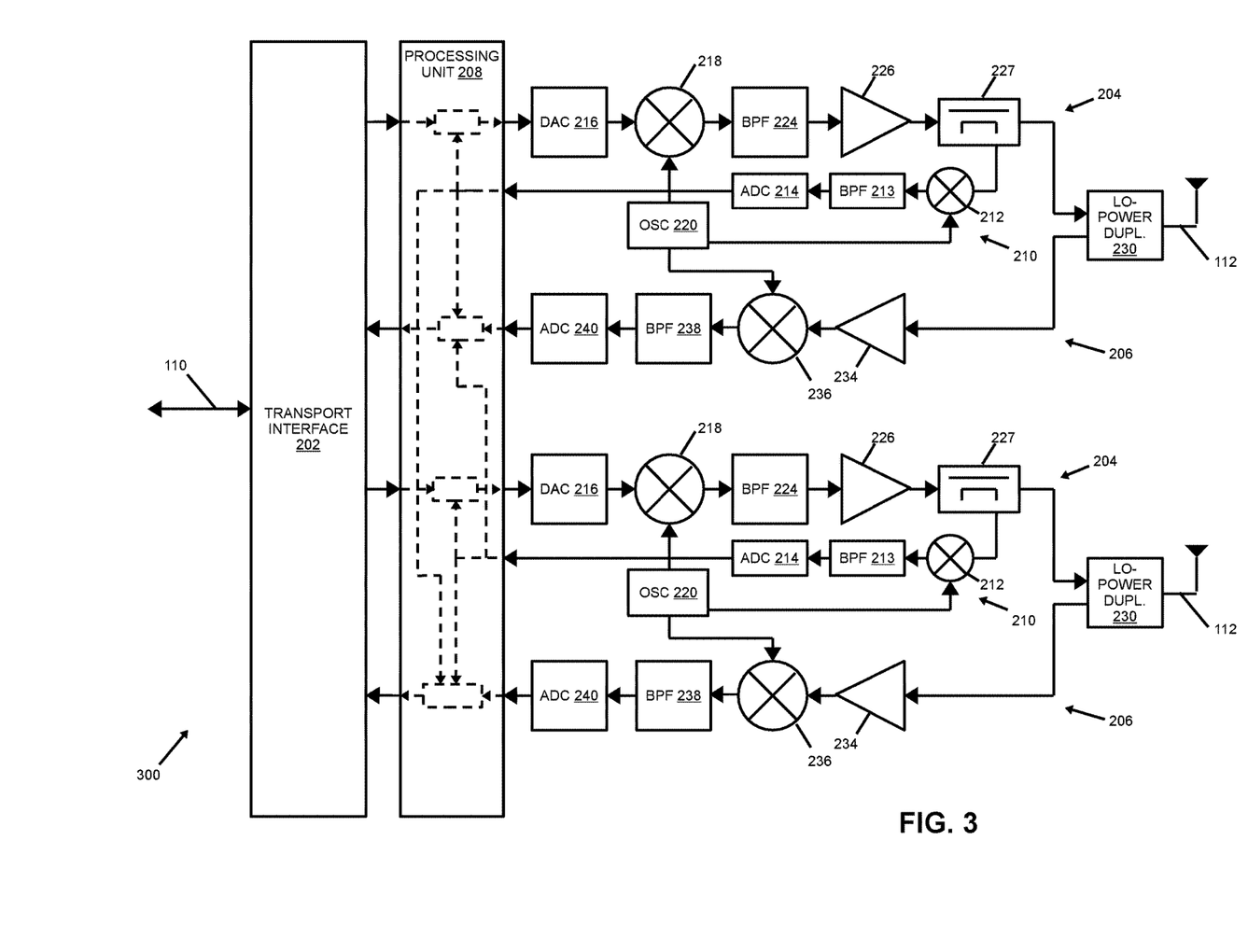

FIG. 3 is a block diagram another exemplary embodiment of a remote antenna unit 300. The remote antenna unit 300 is the same as the remote antenna unit 200 shown in FIG. 2 except as described below. For ease of explanation, those components of remote antenna unit 300 that have corresponding components in the remote antenna unit 200 are referenced in FIG. 3 (and in the following description thereof) with the same reference numerals as used in FIG. 2 for those components, though the components may operate in a slightly different manner.

In the embodiment shown in FIG. 3, a low-power duplexer 230 is used to couple each downstream signal branch 204 and its associated upstream signal branch 206 to its associated antenna 112. However, since the downstream RF signals output by each downstream signal branch 204 are still transmitted at a relatively high power, the low-power duplexer 230 may not by itself provide sufficient isolation between the downstream RF signals transmitted from the remote antenna unit 300 and the received upstream RF signals. To address this issue, the digitized versions of the downstream RF signals that are fed back to the processing unit 208 (for the pre-distortion processing) are also used to suppress any self-interference caused by the transmitted downstream RF signals. This is done by digitally "subtracting" or "cancelling" the transmitted downstream RF signals from the upstream IF data that is otherwise produced in that upstream signal branch 206. Typically, this is done after the post-distortion filtering has been performed. Moreover, the distortion caused by the components in the upstream signal branch 206 being inundated with out-of-band power due to the transmitted downstream RF signals can also be modeled and cancelled in the processing unit 208 using digital signal processing techniques. The signal processing (for example, the self-interference and distortion suppression processing) that is performed for each upstream signal branch 206 can be performed using the digitized version of the downstream analog RF signals output by one or more of the downstream signal branches 204. The self-interference and distortion suppression processing that is performed for each upstream signal branch 206 can be performed using the digitized version of the downstream RF signal produced by only the corresponding downstream signal branch 204 (for example, to reduce the processing complexity) or using the digitized version of the downstream RF signal produced by the corresponding downstream signal branch 204 as well those produced by one or more of the other downstream signal branches 204 (for example, where the downstream RF signals produced by the one or more other downstream signal branches 204 also interfere with or distort the upstream RF signal produced by that upstream signal branch 206).

The self-interference and distortion suppression performed by the processing unit 208, in combination with the low-power duplexer 230, is able, in some implementations, to provide sufficient isolation between the downstream RF signals and the received upstream RF signals in a more compact and cost-effective manner.

Figure 4:
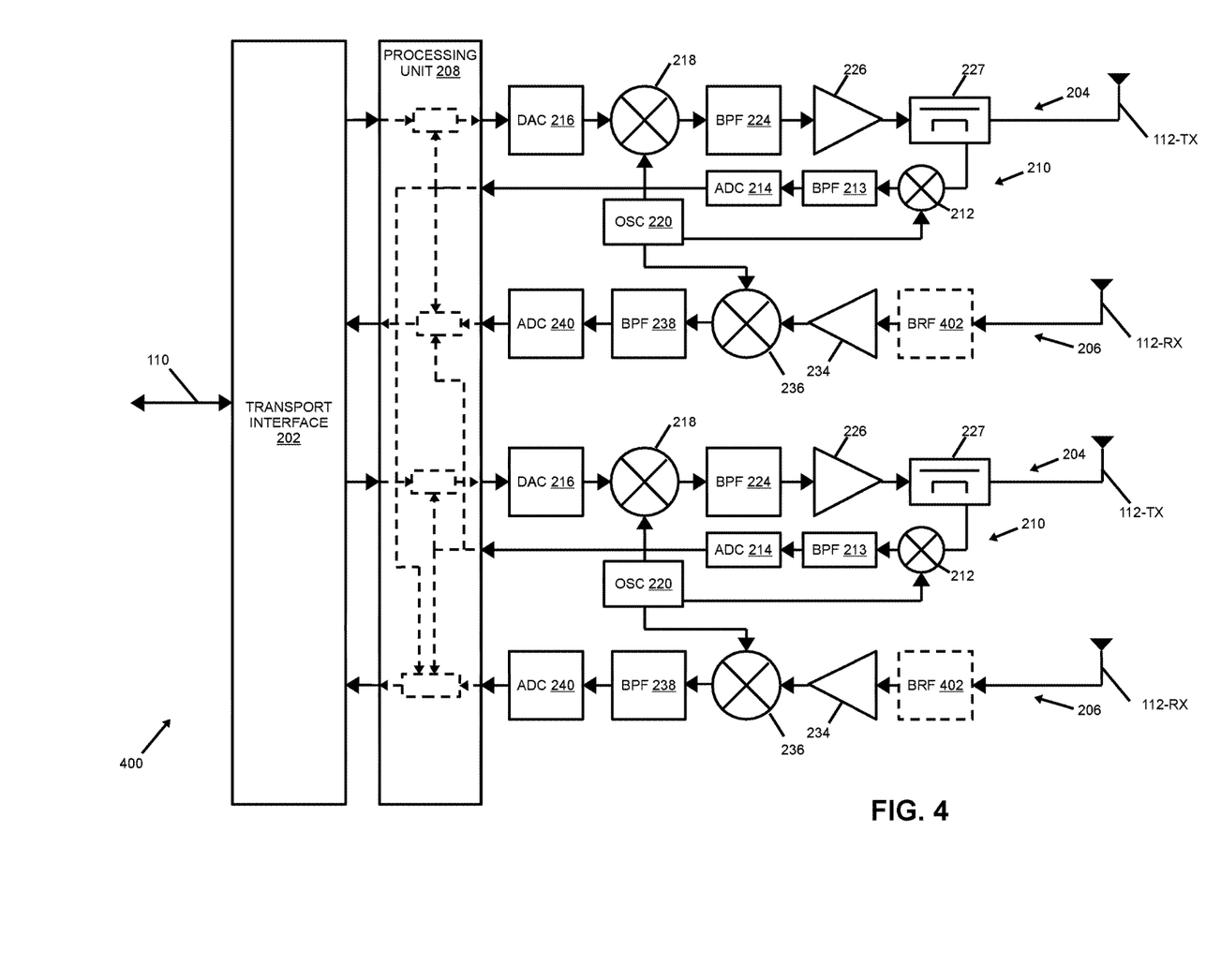

FIG. 4 is block diagram of another exemplary embodiment of a remote antenna unit 400. The remote antenna unit 400 is the same as the remote antenna unit 200 shown in FIG. 2 except as described below. For ease of explanation, those components of remote antenna unit 400 that have corresponding components in the remote antenna unit 200 are referenced in FIG. 4 (and in the following description thereof) with the same reference numerals as used in FIG. 2 for those components though the components may operate in a slightly different manner.

In the embodiment shown in FIG. 4, instead of using a duplexer 230 to couple each downstream signal branch 204 and its corresponding upstream signal branch 206 to a single, shared antenna 112, each downstream signal branch 204 has its own respective antenna 112-TX, and each upstream signal branch 206 has its own respective antenna 112-RX. No duplexers 230 are used. By using separate transmit and receive antennas 112-TX and 112-RX that are spatially isolated from one another, isolation can be provided between the downstream RF signals transmitted from each downstream signal branch 204 and the received upstream RF signals. However, in some applications, it may not possible to arrange the transmit and receive antennas 112-TX and 112-RX so as to provide sufficient isolation between the downstream RF signals transmitted from each downstream signal branch 204 and the received upstream RF signals based solely on spatial isolation of the antennas 112-TX and 112-RX. The exemplary embodiment shown in FIG. 4 is directed to such a situation.

In the exemplary embodiment shown in FIG. 4, as with the exemplary embodiment shown in FIG. 3, the digitized versions of the downstream RF signals that are fed back to the processing unit 208 and used for in suppressing any self-interference caused by the transmitted downstream RF signals. Moreover, as with the exemplary embodiment shown in FIG. 3, the distortion caused by the components in the upstream signal branch 206 being inundated with out-of-band power due to the transmitted downstream RF signals can also be modeled and cancelled in the processing unit 208 using digital signal processing techniques.

In this way, the self-interference and distortion suppression performed by the processing unit 208, in combination with the isolation provided by the arrangement of the transmit and receive antennas 112-TX and 112-RX, may be able to provide sufficient isolation between the downstream RF signals and the upstream RF signals in some situations where the isolation provided by the spatial arrangement of the separate transmit and receive antennas 112-TX and 112-RX is unable to do so by itself.

Also, in the exemplary embodiment shown in FIG. 4, to reduce the likelihood that out-of-band power from the transmitted downstream RF signals inundate the components in the upstream signal branches 206, each upstream signal branch 206 includes a band-rejection filter (BRF) 402 that rejects the frequency bands associated with the downstream RF signals transmitted by the remote antenna unit 400. The use of band-reject filters 402 may not be necessary in all situations. In some embodiments, a transmit band pass filter is applied after the coupler 227 and before the antenna 112 in each of the downstream signal branches 204.

Figure 5:
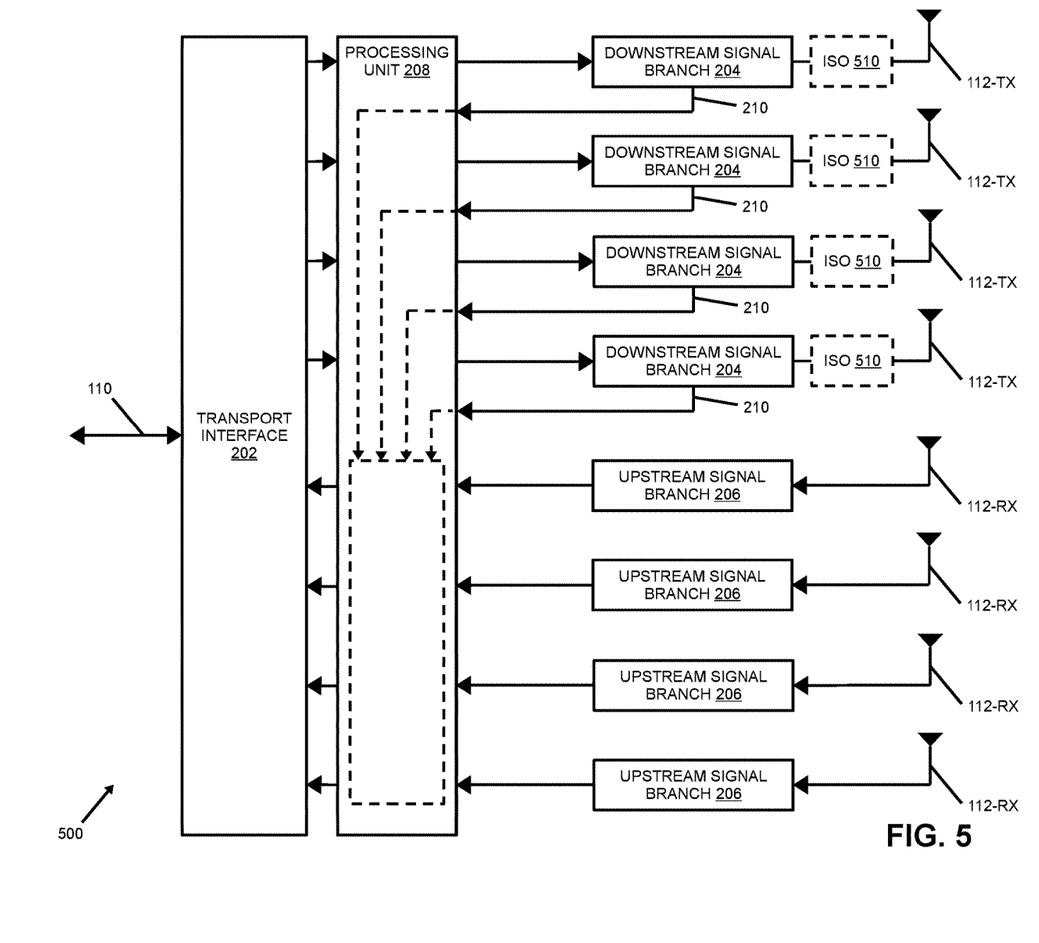

The self-interference and distortion suppression described above can also be used in MIMO or antenna array applications. One such example is illustrated in FIG. 5. FIG. 5 is a block diagram of another exemplary embodiment of a remote antenna unit 500. The remote antenna unit 500 is the same as the remote antenna unit 200 shown in FIG. 2 except as described below. For ease of explanation, those components of remote antenna unit 500 that have corresponding components in the remote antenna unit 200 are referenced in FIG. 5 (and in the following description thereof) with the same reference numerals as used in FIG. 2 for those components though the components may operate in a slightly different manner. Moreover, FIG. 5 has been simplified for ease of explanation.

The remote antenna unit 500 is similar to the one shown in FIG. 4 except that the remote antenna unit 400 has been modified for a MIMO or antenna array application where there is greater number of transmit and receive antennas 112-TX and 112-RX used. In the exemplary embodiment shown in FIG. 5, as with the exemplary embodiment shown in FIG. 4, the digitized versions of the downstream RF signals that are fed back to the processing unit 208 (for the pre-distortion processing) are also fed back to the processing unit 208 for use in providing self-interference and distortion suppression. The self-interference and distortion suppression processing that is performed for each upstream signal branch 206 can be performed using the digitized version of the downstream RF signal produced by only the corresponding downstream signal branch 204 (for example, to reduce the processing complexity) or using the digitized version of the downstream RF signal produced by the corresponding downstream signal branch 204 as well those produced by one or more of the other downstream signal branches 204 (for example, where the downstream RF signals produced by the one or more other downstream signal branches 204 also interfere with or distort the upstream RF signal produced by that upstream signal branch 206). In the embodiment shown in FIG. 5, the output of each downstream signal branch 204 is coupled to a respective transmit antenna 112-TX via a respective isolator 510, reduces so-called "reverse intermodulaton" where the transmitted signal from a first transmit antenna 112-TX mixes with the signals transmitted by a second transmit antenna 112-TX to result in undesirable interference components. The isolator 510 may not be necessary in all cases, depending on, for example, the linearity of the final stages of the downstream signal branch 206.

Also, by using numerous transmit and receive antennas, the output power levels of the downstream RF signals transmitted from each remote antenna unit 108 can be reduced. This should result in a reduction in the amount of self-interference or distortion caused by the transmitted downstream RF signals leaking into to the (receive) upstream signal branches 206 and/or the components in the (receive) upstream signal branches 206 being inundated with out-of-band power. As a result, in some applications, the self-interference and distortion suppression techniques described above and the use of spatially isolated transmit and receive antennas 112-TX and 112-RX, may be sufficient to obviate the need for duplexers.

More generally, the self-interference and distortion suppression techniques described above can be used to provide an additional amount of separation and isolation between the received upstream RF signals and the transmitted downstream RF signals. This additional amount of separation and isolation may be usefully applied in applications where the spatial isolation of the separate transmit and receive antennas is less than optimal (for example, due to the need to achieve an omni-directional antenna structure or due to packaging concerns). One example of where this may be the case is in an omni-directional antenna array having multiple transmit and receive antennas formed on multiple surfaces of a cube structure. Other examples of antenna modules having possibly less than optimal arrangements of transmit and receive antennas where the self-interference and distortion suppression techniques described here may be used are described in U.S. Provisional Patent Application Ser. No. 61/495,235, filed on Jun. 9, 2011, and titled "ANTENNA MODULE HAVING INTEGRATED RADIO FREQUENCY CIRCUITRY", which is hereby incorporated herein by reference.

In addition to the digital self-interference and distortion suppression techniques described above, analog self-interference suppression techniques can be used in which an analog version of each transmitted downstream RF signal is delayed by 180 degrees and subtracted from the received upstream RF signals. One example of how such analog self-interference suppression can be performed is described in U.S. patent application Ser. No. 13/073,111, filed on Mar. 28, 2011, and titled "EXTERNAL MOUNTED AMPLIFIERS WITH ACTIVE INTERFERENCE CANCELATION USING DIVERSITY ANTENNAS", which is hereby incorporated herein by reference.

Although the embodiments shown in FIGS. 1-5 were described as being implemented in a particular type of digital DAS, it is to be understood that the self-interference and distortion suppression techniques described here can be used in other types of DAS, repeater, and distributed base station systems and products. For example, the self-interference and distortion suppression techniques described here can be used in a digital DAS where the signals distributed between the host unit and the remote antenna units are digital baseband data. Examples of digital baseband formats are the formats described in the Open Base Station Architecture Initiative (OBSAI) and Common Public Radio Interface (CPRI) family of standards and specifications. Also, the self-interference and distortion suppression techniques described here can be used in analog DAS and repeater products, in which case analog versions of the transmitted downstream RF signals would be fed back and also used in each of the upstream signal branches (in a manner similar to what is described in the previous paragraph).

The components of the feedback path 210 can be used to provide digitized versions of signals external to the remote antenna unit 108 to the processing unit 208. For example, one or more of the feedback paths 210 includes a switch to selectively couple the input of that feedback path 210 to either the coupler 227 or an antenna 112 (either directly or through a duplexer). In the former case (that is, when the switch couples the input of that feedback path 210 to the coupler 227), a digitized version of the downstream RF signals for that downstream signal branch 204 are fed back to the processing unit 208 for the pre-distortion and self-interference and distortion suppression processing described above.

In the latter case (that is, when the switch couples the input of that feedback path 210 to the antenna 112), signals received via the antenna 112 can be fed back to the signal processing unit 208 instead of a digitized version of the downstream RF signals. This can be done, for example, if a particular feedback path 210 is not needed for the pre-distortion and self-interference and distortion suppression processing described above (for example, because the particular algorithms used for such processing have converged to a stable state or because that particular downstream signal branch 204 is not being used at that time). These fed back signals can used to determine the identity and level of co-channel cells or adjacent-channel cells.

The configuration provided in this latter case can be used for other purposes. For example, a specific sequence or pattern can be radiated from each remote antenna unit in a DAS or from each downstream signal branch 204 (for example, in the LTE Physical Downlink Shared Channel (PDSCH) or the HSPA PDSCH). The path-loss between the different remote antenna units or signal branches 204 can be measured and used to control the base station, remote antenna unit, or downstream signal path 204, for example, for deployment or other purposes or when choosing which unit or path to incorporate in a joint scheduling, joint beamforming or joint MIMO transmission.

EXAMPLE EMBODIMENTS

Example 1 includes a distributed antenna system comprising: a host unit; and at least one remote antenna unit that is communicatively coupled to the host unit; wherein the host unit is configured to communicate a downstream transport signal from the host unit to the remote antenna unit; wherein the remote antenna unit to which the downstream transport signal is communicated uses the downstream transport signal to generate a downstream radio frequency signal for radiation from an antenna associated with the remote antenna unit; wherein the remote antenna unit is configured to communicate an upstream transport signal from the remote antenna unit to the host unit, wherein the upstream transport signal is generated from a received upstream radio frequency signal received at the remote antenna unit; and wherein the remote antenna unit is configured to perform self-interference suppression processing in an upstream signal path using, as an input thereto, a feedback signal derived from the downstream radio frequency signal radiated from the antenna.

Example 2 includes the distributed antenna system of Example 1, wherein the remote antenna system is configured to receive the received upstream radio frequency signal using the same antenna used to radiate the downstream radio frequency signal.

Example 3 includes the distributed antenna system of Example 2, wherein the remote antenna system further comprises a duplexer coupled to the antenna.

Example 4 includes the distributed antenna system of Example 3, wherein the duplexer comprises a low-power duplexer.

Example 5 includes the distributed antenna system of Example 4, wherein the low-power duplexer comprises a mobile handset duplexer.

Example 6 includes any of the distributed antenna systems of Examples 1-5, wherein the remote antenna system is configured to radiate the downstream radio frequency signal from a first antenna and wherein the remote antenna system is configured to receive the received upstream radio frequency signal using a second antenna.

Example 7 includes the distributed antenna system of Example 6, wherein the remote antenna system does not use a duplexer.

Example 8 includes any of the distributed antenna systems of Examples 1-7, wherein the downstream transport signal comprises a digitized version of an original downstream radio frequency signal received at the host unit and wherein the upstream transport signal comprises a digitized version of the received upstream radio frequency signal received at the remote antenna unit.

Example 9 includes any of the distributed antenna systems of Examples 1-8, wherein at least one of the downstream transport signal and the upstream transport signal comprises digital baseband data.

Example 10 includes the distributed antenna system of Example 9, wherein the digital baseband data comprises at least one of OBSAI digital baseband data or CPRI digital baseband data.

Example 11 includes any of the distributed antenna systems of Examples 1-10, wherein the downstream transport signal comprises an analog version of an original downstream radio frequency signal received at the host unit and wherein the upstream transport signal comprises an analog version of the received upstream radio frequency signal received at the remote antenna unit.

Example 12 includes any of the distributed antenna systems of Examples 1-11, wherein a plurality of antennas is coupled to the remote antenna unit.

Example 13 includes any of the distributed antenna systems of Examples 1-12, wherein the distributed antenna system is configured to distribute MIMO signals. Example 14 includes any of the distributed antenna systems of Examples 1-13, wherein the remote antenna unit comprises a feedback path and a switch to selectively couple either the downstream radio frequency signal or an external radio frequency signal to an input of the feedback path.

Example 15 includes a remote antenna unit for use in a distributed antenna system, the remote antenna unit comprising: a transport interface to communicatively couple the remote antenna unit to a host unit included in the distributed antenna system and to receive a downstream transport signal from the host unit; a processing unit coupled to the transport interface; at least one downstream signal branch; and at least one upstream signal branch; wherein the processing unit and downstream signal branch are configured to use the downstream transport signal to generate a downstream radio frequency signal for radiation from an antenna associated with the remote antenna unit; wherein the transport interface is configured to communicate an upstream transport signal from the remote antenna unit to the host unit, wherein the processing unit and the upstream signal branch are configured to generate an upstream signal from a received upstream radio frequency signal received at the remote antenna unit, wherein the transport interface uses the upstream signal to generate the upstream transport signal; and wherein the processing unit is configured to perform self-interference suppression processing on the upstream signal using, as an input thereto, a feedback signal derived from the downstream radio frequency signal radiated from the antenna.

Example 16 includes the remote antenna unit of Example 15, wherein the remote antenna system is configured to receive the received upstream radio frequency signal using the same antenna used to radiate the downstream radio frequency signal.

Example 17 includes the remote antenna unit of Example 16, wherein the remote antenna system further comprises a duplexer coupled to the antenna.

Example 18 includes the remote antenna unit of Example 17, wherein the duplexer comprises a low-power duplexer.

Example 19 includes the remote antenna unit of Example 18, wherein the low-power duplexer comprises a mobile handset duplexer.

Example 20 includes any of the remote antenna units of Examples 15-19, wherein the remote antenna system is configured to radiate the downstream radio frequency signal from a first antenna and wherein the remote antenna system is configured to receive the received upstream radio frequency signal using a second antenna.

Example 21 includes the remote antenna unit of Example 20, wherein the remote antenna system does not use a duplexer.

Example 22 includes any of the remote antenna units of Examples 15-21, wherein the downstream transport signal comprises a digitized version of an original downstream radio frequency signal received at the host unit and wherein the upstream transport signal comprises a digitized version of the received upstream radio frequency signal received at the remote antenna unit.

Example 23 includes any of the remote antenna units of Examples 15-22, wherein at least one of the downstream transport signal and the upstream transport signal comprises digital baseband data.

Example 24 includes the remote antenna unit of Example 23, wherein the digital baseband data comprises at least of one OBSAI digital baseband data or CPRI digital baseband data.

Example 25 includes any of the remote antenna units of Examples 15-24, wherein the downstream transport signal comprises an analog version of an original downstream radio frequency signal received at the host unit and wherein the upstream transport signal comprises an analog version of the received upstream radio frequency signal received at the remote antenna unit.

Example 26 includes any of the remote antenna units of Examples 15-25, wherein a plurality of antennas is coupled to the remote antenna unit.

Example 27 includes any of the remote antenna units of Examples 15-26, wherein the remote antenna unit is configured to distribute MIMO signals. Example 28 includes any of the remote antenna units of Examples 15-27, wherein the remote antenna unit comprises a feedback path and a switch to selectively couple either the downstream radio frequency signal or an external radio frequency signal to an input of the feedback path.

Example 29 includes a remote antenna unit for use in a distributed antenna system, the remote antenna unit comprising: a transport interface to communicatively couple the remote antenna unit to a host unit included in the distributed antenna system and to receive a downstream transport signal from the host unit; a processing unit coupled to the transport interface; at least one downstream signal branch; and at least one upstream signal branch; wherein the processing unit and downstream signal branch are configured to use the downstream transport signal to generate a downstream radio frequency signal for radiation from an antenna associated with the remote antenna unit; wherein the transport interface is configured to communicate an upstream transport signal from the remote antenna unit to the host unit, wherein the processing unit and the upstream signal branch are configured to generate an upstream signal from a received upstream radio frequency signal received at the remote antenna unit, wherein the transport interface uses the upstream signal to generate the upstream transport signal; and wherein the processing unit is configured to pre-distort an input signal to the downstream signal branch for non-linearities in the downstream signal branch using a feedback signal derived from the downstream radio frequency signal radiated from the antenna.

Example 30 includes the remote antenna unit of Example 29, wherein the remote antenna system further comprises a duplexer coupled to the antenna.

Example 31 includes the remote antenna unit of Example 30, wherein the duplexer comprises a high-power duplexer. Example 32 includes any of the remote antenna units of Examples 29-31, wherein the remote antenna unit comprises a feedback path and a switch to selectively couple either the downstream radio frequency signal or an external radio frequency signal to an input of the feedback path.

A number of embodiments have been described. Nevertheless, it will be understood that various modifications to the described embodiments may be made without departing from the spirit and scope of the claimed invention.

What is claimed is:

1. A communication system comprising:
a first unit; and
at least one second unit that is communicatively coupled to the first unit, the at least one second unit including at least one processing unit, at least one downstream signal path, and at least one upstream signal path;
wherein the first unit is configured to communicate a downstream transport signal from the first unit to the second unit;
wherein the second unit to which the downstream transport signal is communicated uses the processing unit and the downstream signal path to generate a downstream radio frequency signal for radiation from an antenna associated with the second unit from the downstream transport signal;
wherein the second unit is configured to communicate an upstream transport signal from the second unit to the first unit;
wherein the upstream transport signal is generated from a received upstream radio frequency signal received at the second unit using the at least one processing unit and the at least one upstream signal path, wherein the upstream signal includes a digital representation of the received upstream radio frequency signal; and
a feedback path configured to digitize the downstream radio frequency signal to provide a digital representation of the downstream radio frequency signal radiated from the antenna to the at least one processing unit;
wherein the second unit is configured to pre-distort an input signal to the downstream signal path for non-linearities in the downstream signal path using the digital representation of the downstream radio frequency signal radiated from the antenna as received from the feedback path;
wherein the second unit is configured to perform self-interference suppression processing in an upstream signal path by digitally subtracting the digital representation of the downstream radio frequency signal radiated from the antenna from the digital representation of the received upstream radio frequency signal as received from the feedback path.

2. The communication system of claim 1, wherein the second unit is configured to receive the received upstream radio frequency signal using the same antenna used to radiate the downstream radio frequency signal.

3. The communication system of claim 2, wherein the second unit further comprises at least one duplexer coupled to the antenna, wherein the at least one duplexer includes at least one of:
a low-power duplexer;
a mobile handset duplexer; or
a high-power duplexer.

4. The communication system of claim 1, wherein:
the second unit is configured to radiate the downstream radio frequency signal from a first antenna; and
the second unit is configured to receive the received upstream radio frequency signal using a second antenna.

5. The communication system of claim 1, wherein:
the downstream transport signal comprises a digitized version of an original downstream radio frequency signal received at the first unit; and
the upstream transport signal comprises a digitized version of the received upstream radio frequency signal received at the second unit.

6. The communication system of claim 1, wherein at least one of the downstream transport signal and the upstream transport signal comprises digital baseband data.

7. The communication system of claim 1, wherein the downstream transport signal comprises an analog version of an original downstream radio frequency signal received at the first unit and wherein the upstream transport signal comprises an analog version of the received upstream radio frequency signal received at the second unit.

8. An antenna unit for use in a communication system, the antenna unit comprising:
- a transport interface to communicatively couple the antenna unit to a remotely located communication device included in the communication system and to receive a downstream transport signal from the remotely located communication device;
- a processing unit coupled to the transport interface;
- at least one downstream signal path; and
- at least one upstream signal path;
- wherein the processing unit and downstream signal path are configured to use the downstream transport signal to generate a downstream radio frequency signal for radiation from an antenna associated with the antenna unit;
- wherein the transport interface is configured to communicate an upstream transport signal from the antenna unit to the remotely located communication device, wherein the processing unit and the upstream signal path are configured to generate an upstream signal from a received upstream radio frequency signal received at the antenna unit, the upstream signal including a digital representation of the received upstream radio frequency signal, wherein the transport interface uses the upstream signal to generate the upstream transport signal; and
- a feedback path configured to digitize the downstream radio frequency signal to provide a digital representation of the downstream radio frequency signal radiated from the antenna to the processing unit;
- wherein the processing unit is configured to pre-distort an input signal to the downstream signal path for non-linearities in the downstream signal path using the digital representation of the downstream radio frequency signal radiated from the antenna as received from the feedback path; and
- wherein the processing unit is configured to perform self-interference suppression processing on the upstream signal by digitally subtracting the digital representation of the downstream radio frequency signal radiated from the antenna from the digital representation of the received upstream radio frequency signal as received from the feedback path.

9. The antenna unit of claim 8, wherein the antenna unit is configured to receive the received upstream radio frequency signal using the same antenna used to radiate the downstream radio frequency signal.

10. The antenna unit of claim 9, wherein the antenna unit further comprises at least one of:
- a low-power duplexer; and
- a high-power duplexer.

11. The antenna unit of claim 8, wherein the antenna unit is configured to radiate the downstream radio frequency signal from a first antenna and wherein the antenna unit is configured to receive the received upstream radio frequency signal using a second antenna.

12. The antenna unit of claim 8, wherein the downstream transport signal comprises a digitized version of an original downstream radio frequency signal received at the remotely located communication device and wherein the upstream transport signal comprises a digitized version of the received upstream radio frequency signal received at the antenna unit.

13. The antenna unit of claim 8, wherein at least one of the downstream transport signal and the upstream transport signal comprises digital baseband data.

14. The antenna unit of claim 13, wherein the digital baseband data comprises at least one of OBSAI digital baseband data or CPRI digital baseband data.

15. The antenna unit of claim 8, wherein the downstream transport signal comprises an analog version of an original downstream radio frequency signal received at the remotely located communication device and wherein the upstream transport signal comprises an analog version of the received upstream radio frequency signal received at the antenna unit.

16. The antenna unit of claim 8, wherein a plurality of antennas is coupled to the antenna unit.

17. The antenna unit of claim 8, wherein the antenna unit is configured to distribute MIMO signals.

18. The antenna unit of claim 8, wherein the antenna unit comprises a feedback path and a switch to selectively couple either the downstream radio frequency signal or an external radio frequency signal to an input of the feedback path.

19. An antenna unit for use in a communication system, the antenna unit comprising:
- a transport interface to communicatively couple the antenna unit to a remotely located communication device included in the communication system and to receive a downstream transport signal from the remotely located communication device;
- a processing unit coupled to the transport interface;
- at least one downstream signal path;
- at least one upstream signal path;
- at least one duplexer between an antenna associated with the antenna unit and both of the at least one downstream signal path and the at least one upstream signal path;
- wherein the processing unit and downstream signal path are configured to use the downstream transport signal to generate a downstream radio frequency signal for radiation from the antenna associated with the antenna unit;
- wherein the transport interface is configured to communicate an upstream transport signal from the antenna unit to the remotely located communication device, wherein the processing unit and the upstream signal path are configured to generate an upstream signal from a received upstream radio frequency signal received at the antenna unit, the upstream signal including a digital representation of the received upstream radio frequency signal, wherein the transport interface uses the upstream signal to generate the upstream transport signal; and
- a feedback path configured to digitize the downstream radio frequency signal to provide a digital representation of the downstream radio frequency signal radiated from the antenna to the processing unit;
- a switch to selectively couple either the downstream radio frequency signal or an external radio frequency signal to an input of the feedback path;
- wherein the processing unit is configured to pre-distort an input signal to the downstream signal path for non-linearities in the downstream signal path using the digital representation of the downstream radio frequency signal radiated from the antenna as received from the feedback path; and wherein the processing unit is configured to perform self-interference suppression processing on the upstream signal by digitally subtracting the digital representation of the downstream radio frequency signal radiated from the antenna from the digital representation of the received upstream radio frequency signal as received from the feedback path.

20. The antenna unit of claim 19, wherein the duplexer comprises a high-power duplexer.

* * * * *